United States Patent
Manley

[11] Patent Number: 5,962,911
[45] Date of Patent: Oct. 5, 1999

[54] SEMICONDUCTOR DEVICES HAVING AMORPHOUS SILICON ANTIFUSE STRUCTURES

[75] Inventor: Martin Harold Manley, Saratoga, Calif.

[73] Assignee: VLSI Technology, Inc., San Jose, Calif.

[21] Appl. No.: 08/941,512

[22] Filed: Sep. 30, 1997

Related U.S. Application Data

[62] Division of application No. 08/639,557, Apr. 29, 1996, Pat. No. 5,723,358.

[51] Int. Cl.⁶ .................................................. H01L 29/00
[52] U.S. Cl. ............................................ 257/530; 257/50
[58] Field of Search .......................... 257/530, 50

[56] References Cited

U.S. PATENT DOCUMENTS

| | | | |
|---|---|---|---|
| 4,174,521 | 11/1979 | Neale | 357/45 |
| 4,420,776 | 12/1983 | Kasten | 357/59 |
| 4,441,167 | 4/1984 | Principi | 365/94 |
| 4,538,167 | 8/1985 | Yoshino et al. | 357/59 |
| 5,070,384 | 12/1991 | McCollum et al. | 357/51 |
| 5,106,773 | 4/1992 | Chen et al. | 437/51 |
| 5,108,945 | 4/1992 | Matthews | 438/210 |
| 5,191,241 | 3/1993 | McCollum et al. | 307/465 |
| 5,233,206 | 8/1993 | Lee et al. | 257/50 |
| 5,248,632 | 9/1993 | Tung et al. | 437/195 |
| 5,258,891 | 11/1993 | Sako | 361/792 |
| 5,272,666 | 12/1993 | Tsang et al. | 365/96 |
| 5,298,784 | 3/1994 | Gambino et al. | 257/529 |
| 5,308,795 | 5/1994 | Hawley et al. | 437/195 |
| 5,311,039 | 5/1994 | Kimura et al. | 257/50 |
| 5,373,169 | 12/1994 | McCollum et al. | 257/50 |
| 5,404,029 | 4/1995 | Husher et al. | 257/50 |
| 5,427,979 | 6/1995 | Chang | 437/190 |
| 5,434,432 | 7/1995 | Spratt et al. | 257/50 |
| 5,438,281 | 8/1995 | Takahashi et al. | 326/86 |
| 5,479,044 | 12/1995 | Narahara et al. | 257/533 |
| 5,726,484 | 3/1998 | Hart et al. | 257/530 |

FOREIGN PATENT DOCUMENTS

| | | | |
|---|---|---|---|
| 83109609 | 10/1983 | China. | |
| 6-24678 | 2/1994 | China | G03G 15/08 |
| 0162 529 | 11/1985 | European Pat. Off. | H01L 29/32 |
| 0452 091 | 10/1991 | European Pat. Off. | H01L 23/525 |
| PCT/US92/ 03919 | 1/1992 | European Pat. Off. | H01L 23/525 |
| 0483 958 | 5/1992 | European Pat. Off. | H01L 23/525 |
| PCT/US92/ 03535 | 11/1992 | European Pat. Off. | H01L 23/525 |
| PCT/US92/ 07453 | 3/1993 | European Pat. Off. | H01L 23/525 |
| 0592 077 | 4/1994 | European Pat. Off. | H01L 23/525 |
| 39 27 033 | 7/1989 | Germany | H01L 45/00 |
| 57-117255 | 7/1982 | Japan | H01L 21/88 |

*Primary Examiner*—Sara Crane
*Attorney, Agent, or Firm*—Martine Penilla & Kim, LLP

[57] ABSTRACT

Disclosed is an apparatus and method for manufacturing antifuse structures on topographically varying silicon substrates. The antifuse structures are intelligently formed over topographically lower silicon substrate regions such that subsequent via hole etching processes do not over-etch underlying antifuse structures. Also discloses an apparatus and method for designing dummy metallization and polysilicon features in close proximity to antifuse structures such that subsequently deposited dielectric materials are induced to form thicker dielectric layers over antifuse structures. Advantageously, subsequent via hole etching does not substantially remove antifuse structure materials with may cause detrimental ionic contamination or antifuse infant mortality. In this manner, standard via hole etching techniques may be implemented for all inter-layer via holes without concern the concern of over-etching sensitive underlying devices.

10 Claims, 4 Drawing Sheets

SEMICONDUCTOR DEVICES HAVING AMORPHOUS SILICON ANTIFUSE STRUCTURES

This is a Divisional application of prior application Ser. No. 08/639,557 filed on Apr. 29, 1996, U.S. Pat. No. 5,723,358.

BACKGROUND OF THE INVENTION

The present invention relates generally to integrated circuits (ICs) that include antifuses and, more particularly, to apparatuses and methods for preventing damaging amorphous silicon antifuse over-etching during via hole etching processes.

Antifuse structures have been used for some time in certain classes of IC chips such as field programmable gate arrays (FPGAs), programmable read-only memories (PROMs) and the like. FPGAs typically include a large number of logic elements, such as AND gates and OR gates, which can be selectively coupled to perform user designed functions. Programming a FPGA is generally accomplished by applying a programming voltage to selected antifuse structures thereby converting them into conductive interconnections.

FIG. 1A schematically illustrates a cross section of a conventional antifuse structure 10. Antifuse structure 10 includes a metal layer 20, which is typically deposited and patterned over an oxide material that overlies a silicon substrate. Metal layer 20 may be formed from any suitable metallization material and deposited using any conventional physical vapor deposition (PVD) process, such as sputtering.

A dielectric layer 18 (e.g., silicon dioxide) is then deposited over metal layer 20. Once dielectric layer 18 is deposited, a photoresist via-link mask (not shown for ease of illustration) is formed over dielectric layer 18 in order to etch a window between metal layer 20 and a subsequent layer. An antifuse layer 22 is then formed over dielectric layer 18 such that direct contact is made with metal layer 20. In order to protect antifuse layer 22 from contamination and possible degradation from coming into direct contact with subsequently deposited metallization layers, a thin barrier layer 24 (e.g., TiW) is deposited over antifuse layer 22. For more information on antifuses and methods for making antifuses, reference may be made to U.S. Pat. Nos. 5,120,679, 5,290,734, and 5,328,868, which are hereby incorporated by reference.

Although there are many advantages associated with implementing antifuses in IC designs, a significant problem is created during the formation of inter-level via holes. As is well known in the art, during various stages of IC fabrication, surface layers typically exhibit a multiplicity of topographic variations which are a result of previously formed underlying IC devices, oxide regions, metallization lines, etc. As a result, the surface regions of subsequently deposited layers will exhibit a variety of thicknesses, which are in part influenced by the underlying topography.

Consequently, when via hole etching steps are performed, some via holes must be created deeper than others. Therefore, the etch time must be long enough to reach the deepest via holes. However, while deep vias become properly etched, devices lying under shallow via holes become damaged due to over-etching.

Although separate photoresist via hole masks may be used to etch deep and shallow via holes separately, it would be expensive to identify the thicknesses underlying each feature requiring an interconnect via hole, and then customize separate via hole masks for each. Aside from being expensive, photoresist contamination may also become a problem. By way of example, after a first set of via holes are formed, a second photoresist layer must be spun on and patterned to define the second set of via holes. However, the first set of via holes will also become filled. Unfortunately, some photoresist residue will remain inside the first set of via holes possibly subjecting the interconnections formed in the first set of via holes to become contaminated with photoresist material.

For illustration purposes, FIG. 1B shows a cross-section of an integrated circuit 20 having a silicon substrate 12, a field oxide region 14 and a thin dielectric layer 16 formed over silicon substrate 12 and field oxide region 14. In IC fabrication, it is customary to construct antifuse structure 10 over field oxide region 14. As is well known in the art, field oxide regions are grown in order to isolate various diffusion regions (not shown for ease of illustration) formed throughout the surface of an IC chip. Therefore, antifuse structures formed over topographically high regions will tend to protrude out from the surface as shown in FIG. 1B. In this example, metallization line 26 is placed over a topographically lower region.

Once the various devices are constructed over the topographically varying surface, a dielectric layer 25 is blanket deposited over the entire wafer surface. By way of example, dielectric layer 25 may be a silicon dioxide ($SiO_2$) layer deposited using a chemical vapor deposition (CVD) technique. As shown, current technology dielectric deposition processes typically form dielectric layers that partly mirror the underlying topography. Therefore, as described above, dielectric layer 25 will tend to exhibit varying thicknesses throughout the silicon substrate. In addition, because antifuse structure 10 is placed over a topographically higher field oxide region 14, dielectric layer 25 will tend to be thinner over antifuse structure 10 and thicker over metallization line 26. Therefore, when a subsequent via hole etch is performed, the etch time must be selected for a sufficient period of time such that a via hole 30 will be etched down to metallization line 26, while at the same time preventing any over-etching to the upper layers of antifuse structure 10 when a via hole 28 is etched.

Unfortunately, the etch time necessary to properly etch down to metallization line 26 may in some circumstances also etch away a significant portion of thin barrier layer 24 of antifuse structure 10. As mentioned above, barrier layer 24 is critically important to prevent subsequently deposited interconnect metallization from causing ionic contamination to antifuse layer 22. By way of example, when a set of conductive interconnects 34 are formed in via holes 28 and 30, proper conductive interconnection will be established to metallization line 26. However, a contaminating contact will be made with antifuse layer 22. As is well known in the art, contaminated antifuse structures may lead to entire programmed IC chips to fail or function improperly. The contamination problem also has the disadvantageous effect of creating latent defects that result in unsuspected failures.

As illustrated in FIG. 1B, when via hole 30 ("a deep via") was etched, the etching material also etched through barrier layer 24 and also began etching into antifuse layer 22. As is well known in the art, when portions of the antifuse material are inadvertently removed during a via etch step, antifuse programming voltage variations may be introduced. When variations in programming voltages occur, antifuses may become deprogrammed and lead to what is commonly known as "infant mortality failure," (i.e., the antifuse link is not properly formed when an appropriate programming voltage is applied, or, once formed, does not stay formed over time).

These problems are further exacerbated in modern high-density devices in which the antifuse structure may already be scaled with sub-micron or even smaller design rules. This is because the antifuse layer is already quite thin in those devices and there is little room for such programming voltage variations and contamination.

In view of the foregoing, what is needed is an apparatus and method for manufacturing antifuse structures that are not over-etched nor contaminated during the formation of conductive interconnecting vias, and further preventing programming voltage variations that produce infant mortality failures.

SUMMARY OF THE INVENTION

The present invention discloses an apparatus and method for manufacturing antifuse structures on topographically varying silicon substrates. The antifuse structures are intelligently formed over topographically lower silicon substrate regions such that subsequent via hole etching processes do not over-etch underlying antifuse structures. The invention also discloses an apparatus and method for designing dummy metallization and polysilicon features in close proximity to antifuse structures such that subsequently deposited dielectric materials may form thicker dielectric layers over antifuse structures. Advantageously, subsequent via hole etching steps do not substantially remove antifuse structure materials which may cause detrimental ionic contamination or antifuse infant mortality. In this manner, standard via hole etching techniques may be implemented for all via holes over a silicon substrate without regard to underlying topography.

In one embodiment, the present invention provides a method for fabricating an integrated circuit device having at least one antifuse structure. The method includes the steps of providing a substrate having a plurality of active regions, a plurality of dummy diffusion regions and a plurality of field oxide regions that are raised relative to the active and dummy diffusion regions. A first dielectric layer is deposited over the substrate such that the first dielectric layer establishes topographically lower regions over the plurality of active regions and dummy diffusion regions, and topographically higher regions over the field oxide regions.

A first metallization layer is deposited over the first dielectric layer, and an antifuse is formed over the first dielectric layer such that the antifuse is positioned over a topographically lower dummy diffusion region. Once the antifuse is formed, a second dielectric layer is formed over the first dielectric layer and the first metallization layer. Via holes are etched through the second dielectric layer such that at least some of the via holes may communicate with segments of the metallization layer and at least one of the via holes may communicate with the antifuse without causing significant over-etching.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

The present invention provides an apparatus and method for manufacturing antifuse structures on a topographically varying silicon substrate such that via hole etching processes do not over-etch portions of over-etch sensitive antifuse structures. The present invention also discloses an apparatus and method for designing dummy metallization and polysilicon features proximate to antifuse structures in order to induce subsequently deposited dielectric materials to form thicker layers over antifuse structures. Due to the thicker dielectric layers formed over the antifuse structures, the dangers of over-etching sensitive antifuse structures will be substantially reduced since the via depth over the antifuse structure will not be substantially shallower than other via holes. In other words, this insures that the via over an antifuse will take a longer period of time to etch and thereby protecting antifuse structures from possible contamination.

Figure 1A:
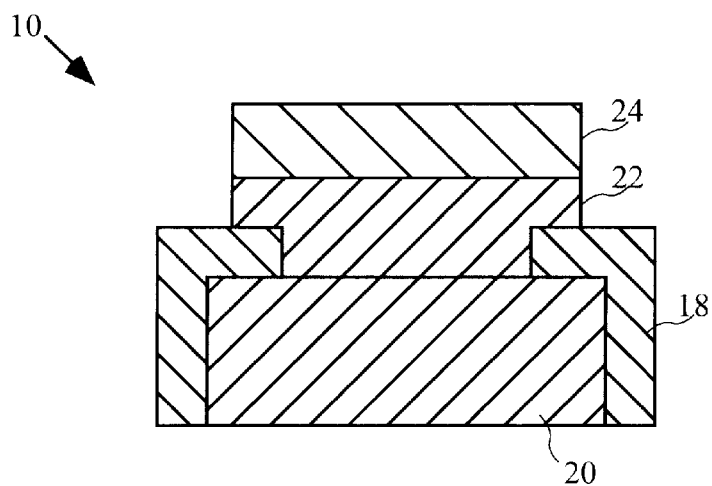
FIG. 1A is a cross-sectional view of a conventional antifuse structure.
Figure 1B:
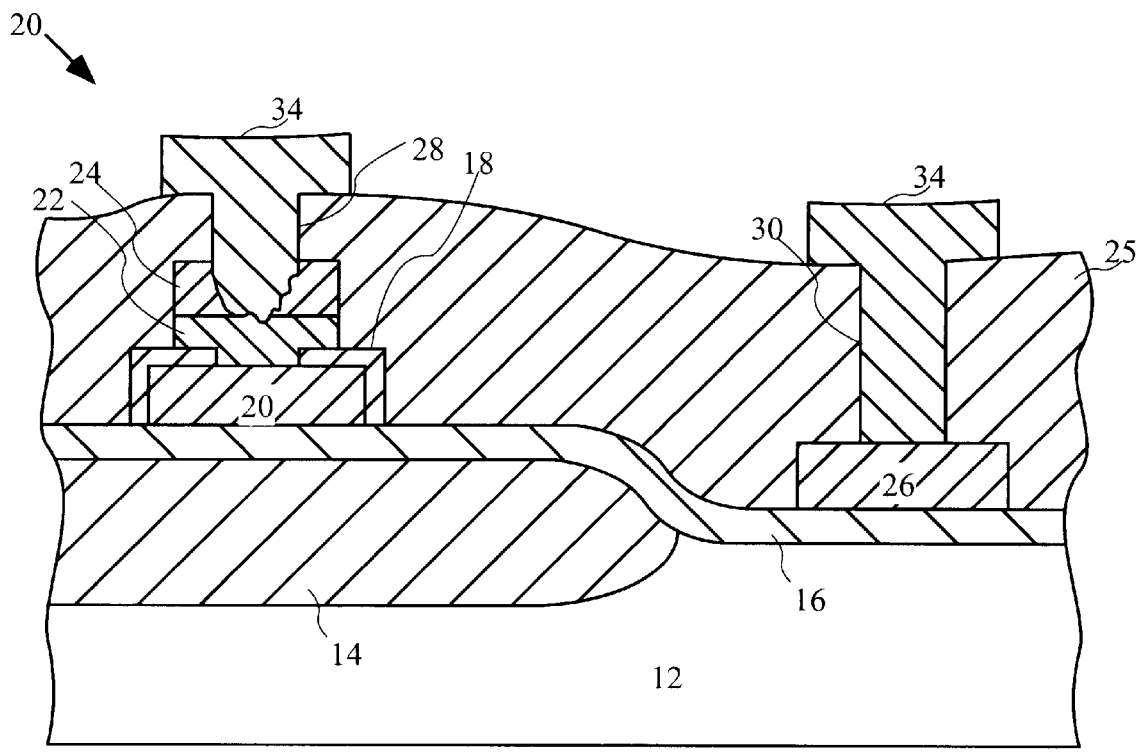
FIG. 1B is a cross-sectional view of a partially fabricated integrated circuit illustrating the damaging effects associated with over-etching sensitive antifuse structures constructed over topographically raised regions.
Figure 2A:
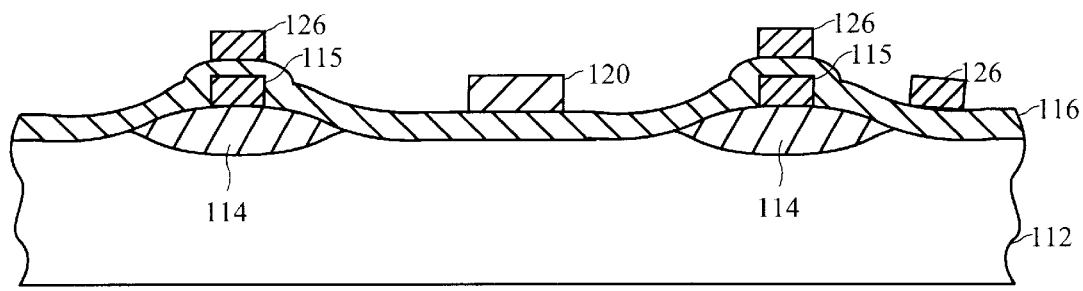
FIG. 2A is a cross-sectional view of a partially fabricated integrated circuit having topographically raised regions in proximity to the region where an over-etching sensitive antifuse structure will be formed in accordance with one embodiment of the present invention.

Having described FIGS. 1A and 1B previously, reference is now drawn to FIG. 2A which illustrates a cross-sectional view of a partially fabricated semiconductor substrate having various previously fabricated layers. As shown in this embodiment, a set of field oxide regions 114 have been selectively grown in predefined regions such that p-type and n-type diffusion regions are adequately isolated from one another. As shown in FIG. 2H, dummy/active diffusion regions 138 may be fabricated between each of the illustrated filed oxide regions 114.

As shown, a pair of polysilicon lines 115 are patterned over field oxide regions 114 in order to further establish topographically raised neighboring regions near regions where antifuse structures will be ultimately constructed. Polysilicon lines 115 may also include an additional top layer of tungsten silicon (WSi) or titanium silicide (TiSi$_2$). In some embodiments, polysilicon lines 115 may be implemented to interconnect various devices (e.g., "active" polysilicon lines), while in other embodiments, polysilicon lines 115 may not interconnect devices and will be referred to as "dummy" polysilicon lines. That is, polysilicon lines 115 may be implemented to primarily provide a topographically raised region near an antifuse structure. Furthermore, although polysilicon lines 115 are shown over each field oxide region 114, it should be understood that polysilicon lines may be formed over some field oxide region 114 while not over others.

Whether polysilicon lines 115 are designed as active or dummy lines, a subsequently deposited dielectric layer will be induced to form thicker regions over the antifuse due to the raised neighboring region. It should be understood that forming polysilicon lines in the described regions may not necessarily require an extra processing step since polysilicon lines may also be required on that same layer to form other devices throughout the silicon substrate. By way of example, a polysilicon gate electrode mask may be necessary to construct a functional IC device, and therefore a simple inexpensive mask modification may be performed to include dummy polysilicon lines 115. Although polysilicon lines 115 may have any variety of thicknesses depending on the particular application, a suitable thickness may be in the range of approximately 2,500 Å to approximately 5,000 Å, and preferably approximately 3,500 Å.

A dielectric layer 116 is then blanket deposited over the entire top surface of the partially fabricated device thereby covering exposed regions on silicon substrate 112, field oxides 114 and polysilicon lines 115. By way of example, dielectric layer 116 may be a silicon dioxide (SiO$_2$) layer deposited using any suitable chemical reactant. In one embodiment, dielectric layer 116 may be deposited by decomposing a tetraethylorthosilicate "TEOS" Si(OC$_2$H$_5$)$_4$ reactant using any suitable deposition method.

Suitable deposition methods may include a chemical vapor deposition (CVD), a low pressure chemical vapor deposition (LPCVD), an atmospheric pressure chemical vapor deposition (APCVD), sub atmospheric chemical vapor deposition (SACVD), a plasma enhanced chemical vapor deposition (PECVD), etc. In this embodiment, deposition is preferably carried out at a temperature of between about 400° C. and 800° C., and preferably at a temperature of about 400° C. Further, the decomposed TEOS reactant is preferably vaporized from a liquid source using any well known vaporizing systems. The decomposition of the TEOS reactant will therefore cause a chemical reaction that produces dielectric layer 116 (SiO$_2$) and byproducts such as 2H$_2$O+4C$_2$H$_4$ which are removed from the deposition apparatus using any well known process.

As is well known in the art, the resulting dielectric layer 116 will generally have varying thicknesses depending upon the underlying topography and conformal nature of the deposition process used. By way of example, a suitable thickness for dielectric layer 116 may be in the range of approximately 6,000 Å to approximately 12,000 Å. Preferably, the layer thickness may be about 8,000 Å.

As shown, an antifuse metallization line 120 is formed over dielectric layer 116 such that a finished antifuse structure is constructed over a low topographic region. In addition, metallization lines 126 are also deposited at the same time antifuse metallization line 120 is deposited. Any suitable deposition method may be employed in depositing metallization lines 120 and 126. By way of example, a physical vapor deposition (PVD) process, such as sputtering may be used. Thereafter, metallization lines 120 and 126 may be defined using any well known masking and etching steps.

In the embodiment shown, the metallization layer is a three-level sandwich of conductive materials including a first layer of titanium-tungsten (TiW) deposited to a thickness of about 2,000 Å, a second layer of aluminum or an alloy of aluminum and copper deposited to a thickness of about 4,000 Å, and a third layer of titanium-tungsten (TiW) deposited to a thickness of about 750 Å. The combined thickness for the three-level sandwich may therefore range between approximately 6,000 Å and approximately 8,000 Å. It will be appreciated that the above-mentioned thickness values are merely illustrative and other thickness values may be substituted depending upon the particular process, design, wafer size, etc.

In other embodiments, certain metallization features may be implemented as dummy metallization features designed to provide topographically raised regions near antifuse structures. In this manner, the resulting raised regions beneficially include subsequently deposited dielectric materials to thickly build up around and over antifuse structures. This advantageously buffers sensitive antifuse structures from damaging via hole over-etching. As can be appreciated, intelligently designing dummy metallization features proximate to antifuse structures may not involve costly additional fabrication steps since a metallization deposition and patterning will still be carried out to perform any necessary interconnecting circuitry on that same layer.

Figure 2B:
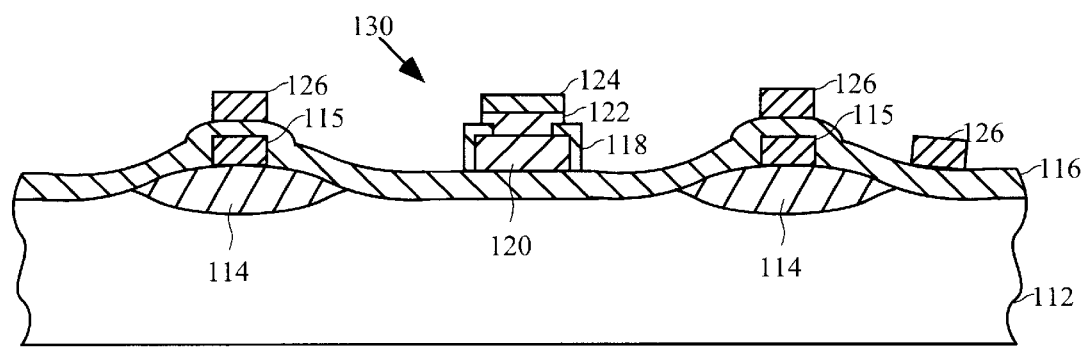
FIG. 2B illustrates a cross-sectional view of a partially fabricated integrated circuit having an antifuse structure constructed over a topographical lower surface region in accordance with one embodiment of the present invention.

Referring now to FIG. 2B, an antifuse structure 130 is shown constructed over a topographically lower surface area. In some embodiments, the lower surface area where antifuse structure 130 is constructed may have an underlying diffusion region. As is well known in the art, p-type and n-type diffusion regions are generally formed to construct transistor drains and sources.

For fabrication simplicity, if a diffusion region was previously formed under antifuse structure 130, the diffusion region would be a non-functional diffusion region in the resulting IC layout. Therefore, the diffusion region would essentially be a "dummy diffusion" region.

As illustrated, antifuse structure 130 includes metallization line 120, a patterned dielectric layer 118, an antifuse layer 122 and a barrier layer 124. Patterned dielectric layer 118 is typically a silicon dioxide layer that may be deposited using any well known process. By way of example, suitable deposition processes may include a PECVD TEOS oxide, Silane oxide or a high density plasma (HDP) oxide. After the dielectric layer has been deposited, a conventional patterning step follows where a via-link hole is patterned over dielectric layer 118 to form a conductive path between metallization line 120 and a subsequently deposited antifuse layer 122. Upon patterning the dielectric layer 118 (i.e., an intermediate dielectric layer), a segment of the metallization layer defined by the walls of the metallization line 120 will remain covered, and a portion of the top of the metallization line 120 will be free of dielectric material to thereby define the via-link hole. The resulting dielectric layer 118 may have a thickness ranging between approximately 200 Å and approximately 1,000 Å, and as for example, about 500 Å.

The subsequently deposited antifuse layer 122 may be any known antifuse material, and preferably amorphous silicon (a-Si), which has an intrinsic resistance in the millions of ohms or higher in its unprogrammed state. Antifuse layer 122 is typically formed by blanket deposition using any number of processes, including CVD, and then etched back to form and defined antifuse layer 122 over metallization layer 120 which makes electrical contact through the aforementioned via-link hole in dielectric layer 118. In this embodiment, antifuse layer 122 may have a thickness in the range of approximately 500 Å to approximately 1,500 Å, and preferably about 800 Å.

In a following step, barrier layer 124 is formed over antifuse layer 122. Like antifuse layer 122, barrier layer 124 is typically formed by a blanket deposition followed by an etch back. Barrier layer 124 may include any well known barrier suitable to prevent ionic contamination caused when metallization atoms from subsequently deposited layers degrade underlying antifuse layer 122. By way of example, suitable barrier layer materials may include titanium-tungsten (TiW), titanium nitride (TiN), tungsten silicide (WSi$_2$), tantalum silicide (TaSi$_2$), tantalum silicon nitride (Ta—Si—N), etc. In this embodiment, barrier layer 124 may have a thickness in the range of approximately 500 Å to approximately 3,000 Å, and preferably about 1,000 Å.

Figure 2C:
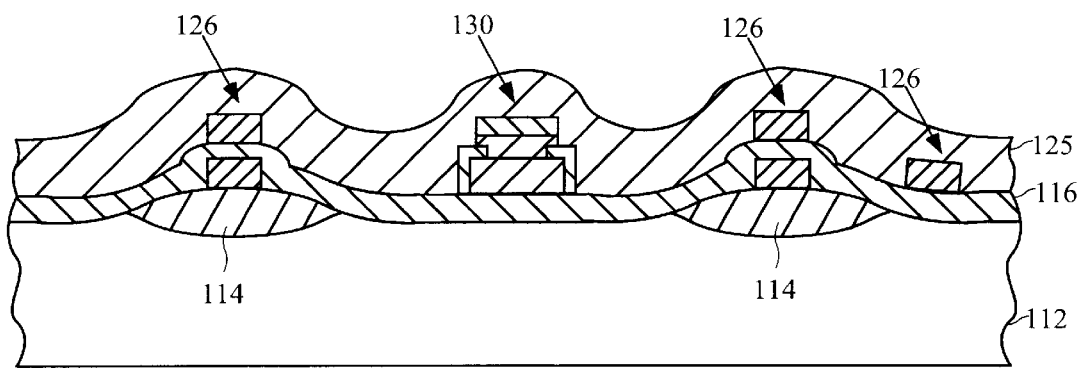
FIG. 2C illustrates the partially fabricated integrated circuit of FIG. 2B after a dielectric layer is deposited over the antifuse structure and metallization lines in accordance with one embodiment of the present invention.

Once antifuse structure 130 has been fabricated over the low surface area, the method will proceed to FIG. 2C where a second dielectric layer 125 is blanket deposited over antifuse structure 130 and metallization lines 126. As described above, any well known deposition process may be used to form second dielectric layer 125. By way of example, suitable dielectric materials may include PECVD TEOS/Silane silicon dioxide SiO$_2$, or a high density plasma (HDP) oxide. Once dielectric layer 125 is deposited, the resulting topography will generally mirror the underlying surface. In one embodiment, the thickness of second dielectric layer 125 may range between approximately 2,000 Å to approximately 10,000, and preferably between approximately 5,000 Å to approximately 7,000 Å depending upon the underlying topography.

Therefore, as described above, in order to induce thicker dielectric layers on top of "over-etch sensitive" antifuse structure 130, the raised neighboring topography was purposefully designed proximate to antifuse structure 130. In this manner, subsequent via hole etching steps will not destructively over-etch barrier layer 124 of antifuse structure 130 and thereby leave antifuse layer 122 dangerously exposed and susceptible to ionic contamination.

At this stage in the fabrication process, the surface variations have become too pronounced to further deposit functional IC chip layers. Therefore, a suitable planarization step must be performed to produce a somewhat evened-out top surface of second dielectric layer 125. Once planarized, further interconnection layers may be fabricated. Suitable planarization techniques may include a spin on glass (SOG) process followed by an etch-back (i.e., "SOG etch-back"), a spin coated resist layer followed by an etch-back (i.e., "resist etch-back"), a chemical mechanical planarization (CMP) process, or any other planarization compatible with the particular fabrication parameters.

Figure 2D:
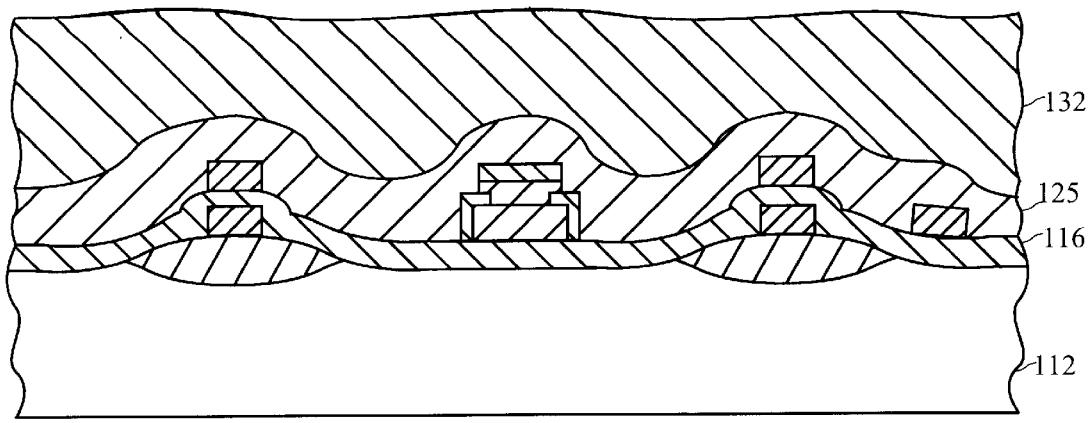
FIG. 2D illustrates the partially fabricated integrated circuit of FIG. 2C after a SOG material has been spin coated over the topographically varying dielectric surface in accordance with one embodiment of the present invention.
Figure 2E:
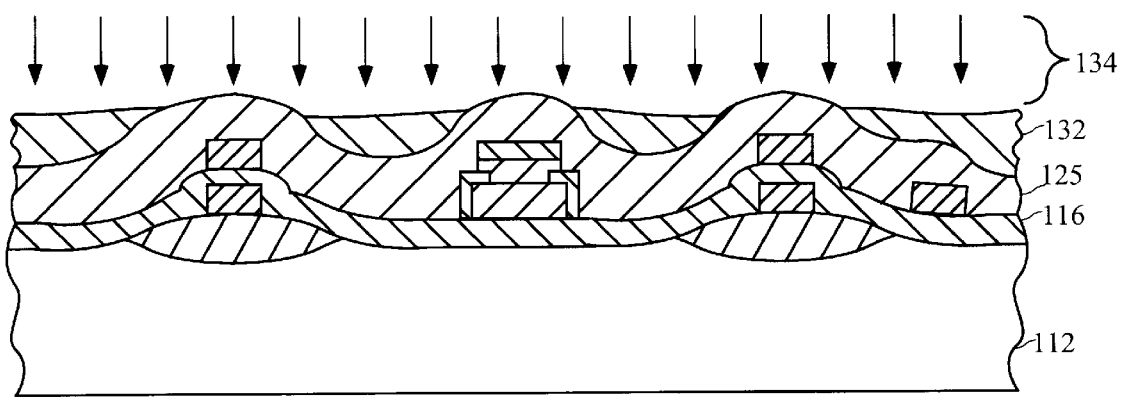
FIG. 2E illustrates the partially fabricated integrated circuit of FIG. 2D after an etch-back process is performed in accordance with one embodiment of the present invention.

Referring now to FIG. 2D, a SOG layer 132 is shown spun on to a thickness that is suitable to fill-in low topographical regions and create a semi-flat top surface. The thick SOG material is then etched-back to remove most of the material such that raised regions become exposed, and low regions remain filled with the SOG material. By way of example, FIG. 2E shows the resulting surface after the etch material 134 is used. Although any suitable etch material may be used to complete the etch-back step, a dry etch having a chemical composition of CF$_4$ or CHF$_3$ is preferably used.

The etch-back process is therefore preferably carried out to insure that any SOG material overlying regions where contact vias will ultimately be formed are fully removed. This is to insure that no SOG material inadvertently ends up in a via hole and causes "via poisoning." By way of example, if via poisoning inadvertently occurs, the chemical reactions may cause the via hole interconnection to fail and possibly cause the malfunction of the entire finished IC chip.

Figure 2F:
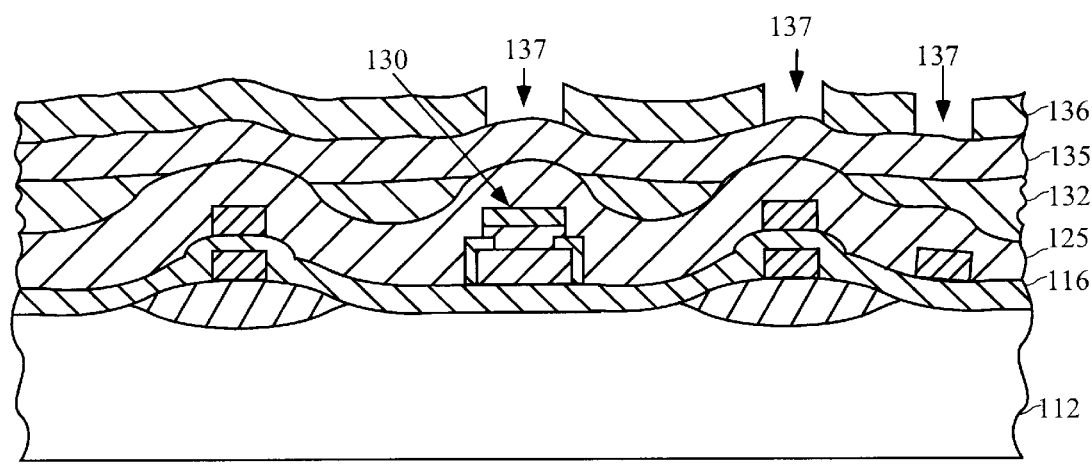
FIG. 2F illustrates the partially fabricated integrated circuit of FIG. 2E after a photoresist mask is spun on and via hole patterns have been defined in accordance with one embodiment of the present invention.

After the SOG etch-back process, a dielectric layer 135 is deposited over the remaining SOG material and exposed regions of second dielectric layer 125 as illustrated in FIG. 2F. Dielectric layer 135 is preferably deposited using a PECVD Silane/TEOS, or a high density plasma (HDP) oxide deposition process. Although the thickness of dielectric layer 135 may vary, a preferred thickness may range between about 4,000 Å and 10,000 Å, and preferably a thickness of about 5,000 Å.

Once dielectric layer 135 has been deposited, a photoresist layer 136 is spin coated over the top surface of dielectric layer 135. A photolithography reticle mask (not shown for ease of explanation) is then implemented to selectively expose photoresist regions where via hole etching is desired. By way of example, a set of via holes 137 have been defined over underlying antifuse structure 130 and metallization lines 126. The via holes are then etched using any suitable etching process. Suitable via hole etching processes may include dry plasma (CF$_4$/CHF$_3$) etching processes such as reactive ion etching (RIE).

Figure 2G:
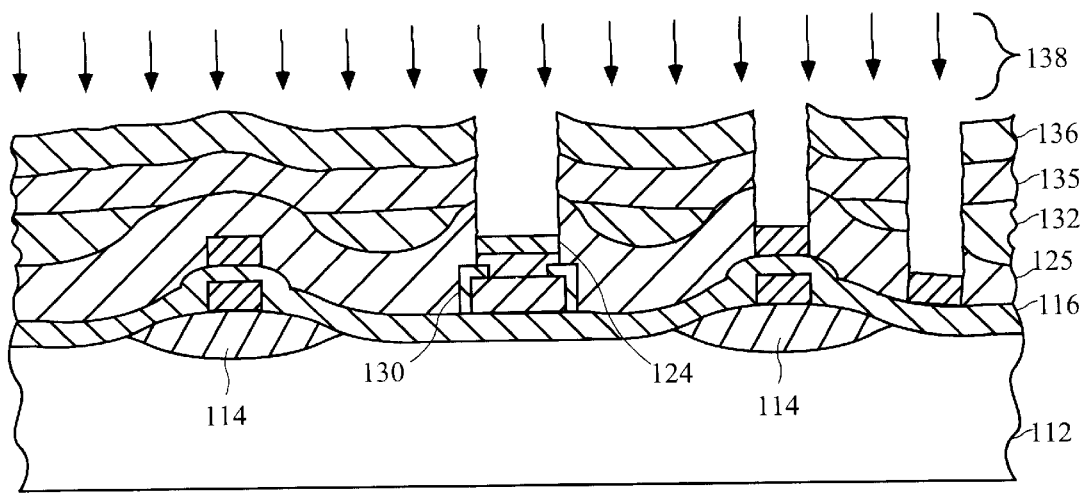
FIG. 2G illustrates the partially fabricated integrated circuit of FIG. 2F after a via hole etching step is performed in accordance with one embodiment of the present invention.
Figure 2H:
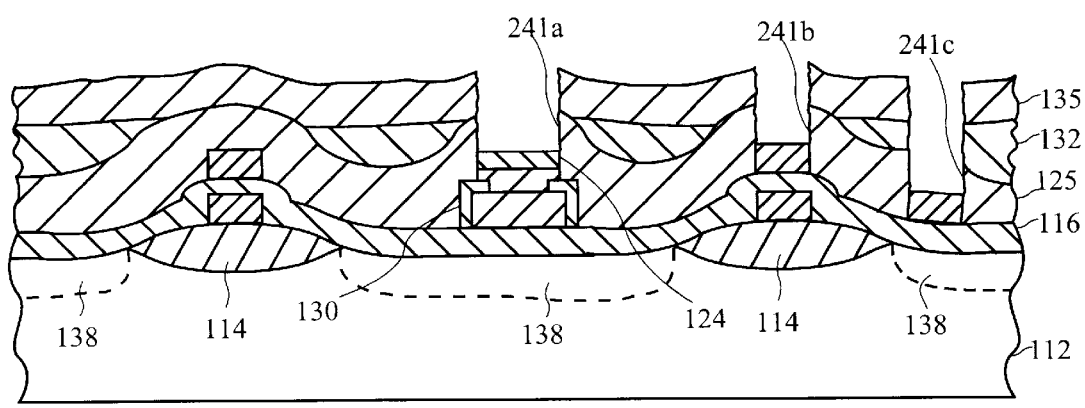
FIG. 2H illustrates the partially fabricated integrated circuit of FIG. 2G after the photoresist mask is removed in accordance with one embodiment of the present invention.

FIG. 2G illustrates the etching step where an etching material 138 is applied such that the exposed via hole mask regions provide a path for etching material 138. In this manner, the via holes may be defined down to the underlying devices. It should be understood that some over-etch will typically be required to reach underlying devices that are slightly deeper than others. As illustrated, the etching step was successfully able to reach each of the via holes without causing damage to antifuse structure 130.

This was primarily facilitated by placing antifuse structure 130 over a topographically lower region, and placing polysilicon lines 115 over field oxide regions 114. Furthermore, polysilicon lines 115 also beneficially induced thicker dielectric layers over antifuse structure 130 which aided in the prevention of damaging over-etching. Of course, intelligently placing dummy polysilicon lines and metallization features will also benefit other devices that are sensitive to over-etching.

In FIG. 2H, photoresist layer 136 is removed using any suitable resist removal process. By way of example, suitable resist removal processes include solvent-type resist strippers, inorganic strippers, plasma resist stripping, etc. Preferably, an oxygen plasma stripping method may be employed in order to successfully strip the resist without leaving resist particles behind that may contaminate subsequently deposited metallization interconnect layers.

The resulting via holes 241a (over antifuse structure 130) and via holes 241b and 241c (over metallization lines 126) illustrate the benefits derived of intelligently placing antifuse structure 130 over a topographically low region of the IC chip. In one embodiment, via holes 241a and 241b may have a depth of approximately 10,000 Å. Although via 241c (e.g., a deeper via) may required a longer etch time to fully etch down via 241c, the resulting depth is not substantially more than that required to etch down to antifuse structure 130. By way of example, deeper via 241c may have a depth of approximately 12,000 Å. As a result, damage is avoided to barrier layer 124 and antifuse layer 122 is shielded from the destructive effects of ionic contamination. In addition, it should be appreciated that barrier layer 124 also provides some selectivity that provides a slower etch rate over antifuse structure 130 while etching down deeper via holes.

While this invention has been described in terms of several preferred embodiments, there are alterations, permutations, and equivalents which fall within the scope of this invention. It should also be noted that there are may alternative ways of implementing both the process and apparatus of the present invention. For example, this invention may be implemented to intelligently place any IC device that is sensitive to over-etching in topographically lower regions in order to prevent destructive over-etching during via hole formation. Further, additional dummy features other than polysilicon and metallization may be designed proximate to over-etch sensitive devices in order to induce thicker dielectric layers over the sensitive devices. In this manner, the problem of over-etching sensitive devices during via hole formation is substantially avoided. It is therefore intended that the following appended claims be interpreted as including all such alterations, permutations, and equivalents as fall within the true spirit and scope of the present invention.

What is claimed is:

1. An integrated circuit device, comprising:

a substrate having a plurality of active regions, a plurality of dummy diffusion regions and a plurality of field oxide regions that are raised relative to the active and dummy diffusion regions;

a first dielectric layer positioned over the substrate such that the first dielectric layer has topographically lower regions over the plurality of active regions and dummy diffusion regions and topographically higher regions over the field oxide regions;

a first metallization layer defining a network of metallization lines, at least some of the metallization lines being arranged to electrically interconnect preselected ones of the plurality of active regions, wherein at least some of the metallization lines pass over associated field oxide regions;

an antifuse positioned over the first dielectric layer such that the antifuse is positioned over an associated dummy diffusion region and not over the field oxide regions, the antifuse includes, a portion of the first metallization layer that is positioned over the first dielectric layer, and an intermediate dielectric layer covering a segment of the first metallization layer such that a via-link opening is provided in the intermediate dielectric to provide an electrical path with the portion of the first metallization layer;

an amorphous silicon layer formed over the intermediate dielectric layer such that the amorphous silicon layer makes direct contact with the first metallization layer through the via-link opening in the intermediate dielectric; and a barrier layer formed over the amorphous silicon layer, and a second dielectric layer positioned over the first dielectric layer and the first metallization layer, the second dielectric layer having a multiplicity of via holes, wherein at least some of the via holes are positioned to communicate with segments of the metallization layer and one of the via holes is positioned to communicate with the antifuse.

2. The integrated circuit device as recited in claim 1, wherein none of the via holes designed to communicate with the segments of the metallization layer are significantly deeper than the via hole positioned to communicate with the antifuse.

3. The integrated circuit device as recited in claim 1, wherein the antifuse barrier layer has a thickness in the range of approximately 500 Å to approximately 2,000 Å and the barrier layer is not substantially etched away when the via hole positioned over the antifuse is formed.

4. The integrated circuit device as recited in claim 1, further comprising a plurality of dummy polysilicon segments positioned between the substrate and the first dielectric layer such that selected ones of the plurality of dummy polysilicon segments provide a topographically raised region for the first dielectric layer and the first metallization layer.

5. The integrated circuit device as recited in claim 4, wherein the dummy polysilicon segments are positioned over selected ones of the plurality of field oxide regions such that the first metallization lines are generally vertically aligned over selected ones of the plurality of field oxide regions and the dummy polysilicon segments.

6. The integrated circuit device as recited in claim 1, wherein the first dielectric layer has a thickness between approximately 6,000 Å and approximately 12,000 Å.

7. The integrated circuit device as recited in claim 1, wherein the second dielectric layer has a thickness between approximately 2,000 Å and approximately 10,000 Å.

8. The integrated circuit device as recited in claim 1, wherein the antifuse barrier layer is a titanium-tungsten barrier layer.

9. The integrated circuit device as recited in claim 1, wherein at least some of the plurality of field oxide regions are approximately 5000 Å thick.

10. The integrated circuit device as recited in claim 4, wherein at least some of the plurality of dummy polysilicon segments have a thickness ranging between approximately 2,500 Å to approximately 5000 Å.

* * * * *